(12) United States Patent
Yamashita et al.

(10) Patent No.: US 10,680,082 B2
(45) Date of Patent: Jun. 9, 2020

(54) VERTICAL FET PROCESS WITH CONTROLLED GATE LENGTH AND SELF-ALIGNED JUNCTIONS

(71) Applicant: International Business Machines Corporation, Armonk, NY (US)

(72) Inventors: Tenko Yamashita, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/411,924

(22) Filed: May 14, 2019

(65) Prior Publication Data

US 2019/0267474 A1   Aug. 29, 2019

Related U.S. Application Data

(63) Continuation of application No. 15/611,981, filed on Jun. 2, 2017, now Pat. No. 10,396,178.

(51) Int. Cl.
*H01L 29/66* (2006.01)
*H01L 29/78* (2006.01)
(Continued)

(52) U.S. Cl.
CPC .... *H01L 29/66666* (2013.01); *H01L 29/0847* (2013.01); *H01L 29/165* (2013.01);
(Continued)

(58) Field of Classification Search
CPC ........... H01L 27/088; H01L 21/823487; H01L 21/76229; H01L 21/823481
See application file for complete search history.

(56) References Cited

U.S. PATENT DOCUMENTS 6,770,534 B2   8/2004  Cho et al.
6,846,709 B1   1/2005  Iojek
(Continued)

OTHER PUBLICATIONS

Non-Final office action received for U.S. Appl. No. 15/611,981 dated Sep. 25, 2018, 26 pages.
List of IBM Patents or Applications Treated as Related.

*Primary Examiner* — Kyoung Lee
*Assistant Examiner* — Christina A Sylvia
(74) *Attorney, Agent, or Firm* — Amin, Turocy & Watson, LLP

(57) ABSTRACT

Method and structure of forming a vertical FET. The method includes depositing a bottom source-drain layer over a substrate; depositing a first heterostructure layer over the bottom source-drain layer; depositing a channel layer over the first heterostructure layer; depositing a second heterostructure layer over the channel layer; forming a first fin having a hard mask; recessing the first and the second heterostructure layers to narrow them; filling gaps with an inner spacer; laterally trimming the channel layer to a narrower width; depositing a bottom outer spacer over the bottom source-drain layer; depositing a high-k layer on the bottom outer spacer, the first fin, and the hard mask; and depositing a metal gate layer over the high-k and top outer spacer to produce the vertical FET. Forming another structure by recessing the metal gate layer below the second inner spacer.

20 Claims, 17 Drawing Sheets

(51) Int. Cl.
*H01L 29/165* (2006.01)
*H01L 29/08* (2006.01)
*H01L 29/786* (2006.01)
*H01L 29/51* (2006.01)

(52) U.S. Cl.
CPC .... *H01L 29/7827* (2013.01); *H01L 29/78642* (2013.01); *H01L 29/517* (2013.01)

(56) References Cited

U.S. PATENT DOCUMENTS

| | | |
|---|---|---|
| 7,683,428 B2 | 3/2010 | Chidambarrao et al. |
| 8,637,849 B2 | 1/2014 | Deligianni et al. |
| 9,287,362 B1 | 3/2016 | Basu et al. |
| 9,502,407 B1 | 11/2016 | Anderson et al. |
| 10,026,653 B2 | 7/2018 | Anderson et al. |
| 10,153,367 B2 | 12/2018 | Cheng et al. |
| 10,236,214 B2 | 3/2019 | Cheng et al. |
| 2004/0232480 A1* | 11/2004 | Ohta ................. H01L 27/0688 257/328 |
| 2006/0261406 A1 | 11/2006 | Chen |
| 2011/0068418 A1* | 3/2011 | Lung ................. B82Y 10/00 257/413 |
| 2016/0365411 A1 | 12/2016 | Yeh et al. |
| 2017/0330965 A1 | 11/2017 | Basker et al. |
| 2018/0005896 A1 | 1/2018 | Mallela et al. |
| 2018/0006151 A1 | 1/2018 | Bergendahl et al. |

* cited by examiner

VERTICAL FET PROCESS WITH CONTROLLED GATE LENGTH AND SELF-ALIGNED JUNCTIONS

FIELD OF THE INVENTION

The present invention relates to an improved vertical field-effect transistor (FET) process. More particularly, the present invention relates to an improved vertical FET process with controlled gate length and self-aligned junctions.

BACKGROUND

FETs are transistors that use an electrical field to control the electrical behavior of the device. The fin refers in a semiconductor material patterned on a substrate that often has exposed surfaces that form the narrow channel between source and drain region layers. Vertical FETs often include a vertical channel and active source and drain region layers arranged beneath and above the channel. A thin dielectric layer arranged over the fin separates the fin channel from the gate. Like in any transistors, there is a strong need to solve both gate length control and junction position control problems in vertical FETs. In the conventional lateral FinFET transistors, gate length is defined by lithography or sidewall image transfer process. However, in the vertical FET architecture where the channel direction (transport direction) is arranged vertically on the substrate, none of the conventional methods used to define gate length is applicable. The gate spacer thickness and the source-drain extension thickness are also difficult to control in the vertical architecture. It is critical to control them because their thicknesses are closely related to junction positions.

SUMMARY

The present invention provides a method of forming a vertical field-effect transistor (FET), the method includes: depositing a highly doped bottom source-drain layer over a substrate of a first type; depositing a first heterostructure layer over the highly doped bottom source-drain layer; depositing a channel layer over the first heterostructure layer; depositing a second heterostructure layer over the channel layer; forming a first fin having a hard mask there on, wherein the hard mask is disposed on the second heterostructure layer; recessing the first and the second heterostructure layers such that they are narrower than the first fin and the hard mask; filling gaps formed by the recessed first and second heterostructure layers with a dielectric inner spacer; laterally trimming the channel layer to a narrower width of from about 3 to about 10 nm and ranges there between; depositing a dielectric bottom outer spacer over the bottom source-drain layer; depositing a high-k dielectric layer on the bottom outer spacer, the first fin, and the hard mask; and depositing a metal gate layer on top of the high-k dielectric layer and the bottom outer spacer; depositing top outer spacer; and forming a top source-drain epitaxial layer to produce the vertical FET. Those who are skilled in the field of semiconductor device can realize that the gate length in such formed vertical transistors is defined by the thickness of channel layer formed by epitaxial growth on blanket wafers. And it is known that such thickness can be very precisely controlled. The physical length of the gate metal is equal or very close to the channel layer thickness minus twice the thickness of the high-k. Those who are skilled could also realize that the use of inner spacer structures is critical because they assist in defining gate length and the junction positions.

The present invention also provides a vertical field-effect transistor (FET) structure, which includes: a substrate of a first type; a highly doped bottom source-drain layer disposed on the substrate of the first type; a dielectric bottom outer spacer disposed on the highly doped bottom source-drain layer; a recessed first heterostructure layer disposed on the highly doped bottom source-drain; a channel layer disposed on the recessed first heterostructure layer; a recessed second heterostructure layer disposed on the channel layer; a first dielectric inner spacer disposed between the dielectric bottom outer spacer and the recessed first heterostructure; a fin including the recessed first and the second heterostructure layers and the channel layer; a high-k dielectric layer disposed on the bottom outer spacer and the channel layer; dielectric top outer spacer disposed on top of the high-k dielectric and a metal gate layer; a second dielectric inner spacer disposed between the dielectric top outer spacer and the recessed second heterostructure; and a top source-drain epitaxial layer of a second type disposed on the first fin and the dielectric top inner spacer and the dielectric top outer spacer resulting in the vertical FET.

The present invention also provides another vertical field-effect transistor (FET) structure, which includes: a substrate of a first type; a highly doped bottom source-drain layer disposed on the substrate of the first type; a dielectric bottom outer spacer disposed on the highly doped bottom source-drain layer; a recessed first heterostructure layer disposed on the highly doped bottom source-drain; a channel layer disposed on the recessed first heterostructure layer; a recessed second heterostructure layer disposed on the channel layer; a first dielectric inner spacer disposed between the dielectric bottom outer spacer and the recessed first heterostructure; a fin including the recessed first and the second heterostructure layers and the channel layer; a high-k dielectric layer disposed on the bottom outer spacer and the channel layer; a dielectric top outer spacer disposed on top of the high-k dielectric; a second dielectric inner spacer disposed between the dielectric top outer spacer and the recessed second heterostructure; a metal gate layer directionally recessed below the second dielectric inner spacer; and a top source-drain epitaxial layer of a second type disposed on the first fin and the dielectric top inner spacer and the dielectric top outer spacer resulting in the vertical FET.

It is to be noted that the sequence of the process steps described above and in the claims below may not follow the exact sequence as described. For example, the highly doped bottom source-drain layer may not be formed at the beginning of the process. It may be formed after the fin structure is formed. For another example, the high-k and metal gate may be formed after both top and bottom source-drain's are formed, which would be in consistence with the well-known replacement metal gate (RMG) process scheme. But in any of the embodiments, the gate length is defined by making use of the multi-layer structure including the first heterostructure layer, the channel layer and the second heterostructure. The inner spacers are formed in the multi-layer fins by filling the gaps created by selectively recessing heterostructures. The channel layer is laterally etched to a narrow width in certain downstream process steps.

BRIEF DESCRIPTION OF THE DRAWINGS

Embodiments will be described in more detail in conjunction with the accompanying drawings, in which:

FIG. 7 illustrates a diagram of laterally trimming the channel layer to a narrower width of from about 3 to about 10 nm and ranges there between;

DETAILED DESCRIPTION OF THE PREFERRED EMBODIMENTS

Figure 1:
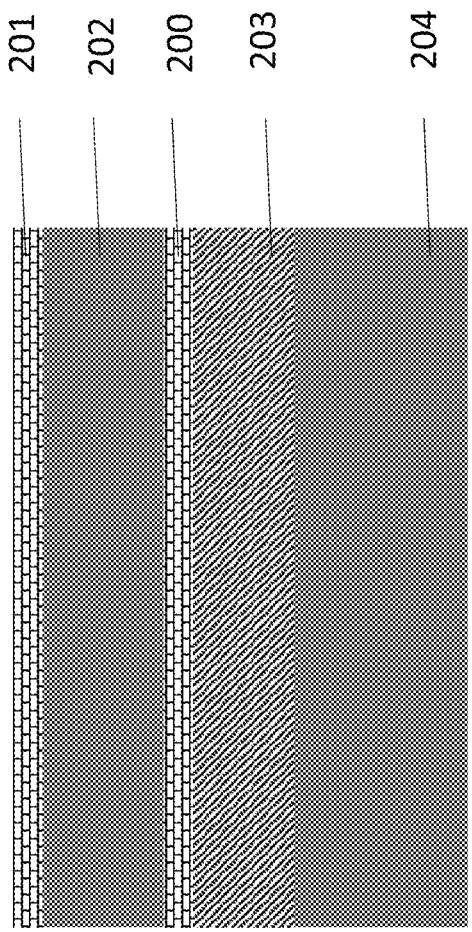
FIG. 1 illustrates a diagram of depositing a highly doped bottom source-drain layer over a substrate of a first type; depositing a first heterostructure layer over the highly doped bottom source-drain layer; depositing a channel layer over the first heterostructure layer; and depositing a second heterostructure layer over the channel layer.

The present invention provides a method which relates to an improved vertical FET process with controlled gate length and self-aligned junctions and a structure of fabricating such a device. The present invention is described in greater detail by referring to the following discussion and drawings that accompany the present disclosure.

It will be readily understood that components of the present invention, as generally described in the figures herein, can be arranged and designed in a wide variety of different configurations in addition to the presently described preferred embodiments. Thus, the following detailed description of some embodiments of the present invention, as represented in the figures, is not intended to limit the scope of the present invention as claimed, but is merely representative of selected presently preferred embodiments of the present invention.

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others. Deposition also includes a so-called epitaxial growth process which deposits single crystalline material on a single crystalline substrate.

Removal/etching is any process that removes material from the wafer. Examples include etch processes (either wet or dry), and chemical-mechanical planarization (CMP), and the like. A dry etch process such as reactive ion etching (RIE) uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or rapid thermal annealing. Annealing serves to activate the implanted dopants. Selective doping of various layers of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The metal gate layer is electrically insulated from the main semiconductor n-channel or p-channel by a thin layer insulating material, for example, silicon dioxide or high dielectric constant (high-k) dielectrics, which makes the input resistance of the transistor relatively high.

The present invention is to be understood within the context of the description provided below. The description provided below is to be understood within the context of the Figures provided and described above. The Figures are intended for illustrative purposes and, as such, are not necessarily drawn to scale.

FIG. 1 illustrates a diagram of depositing a highly doped bottom source-drain 203 layer over a substrate of a first type 204, depositing a first heterostructure layer 200 over the highly doped bottom source-drain layer 203, depositing a channel layer 202 over the first heterostructure layer 200, and depositing a second heterostructure layer 201 over the channel layer 202. The bottom source-drain 203 can be silicon or silicon germanium. The first heterostructure layer 200 and second heterostructure layer 201 can either be the same or different materials. The material used for heterostructure layers can be silicon germanium. The heterostructure layer can have a thickness from about 4 to about 10 nm and ranges there between and the thickness of the first and second heterostructure layers can be the same or different. The channel layer 202 can have a thickness from about 10 to about 50 nm and ranges there between. The material used for the channel layer can be silicon. The highly doped bottom source-drain layer 203 can have a thickness of about 30 to about 50 nm and ranges there between.

Figure 2:
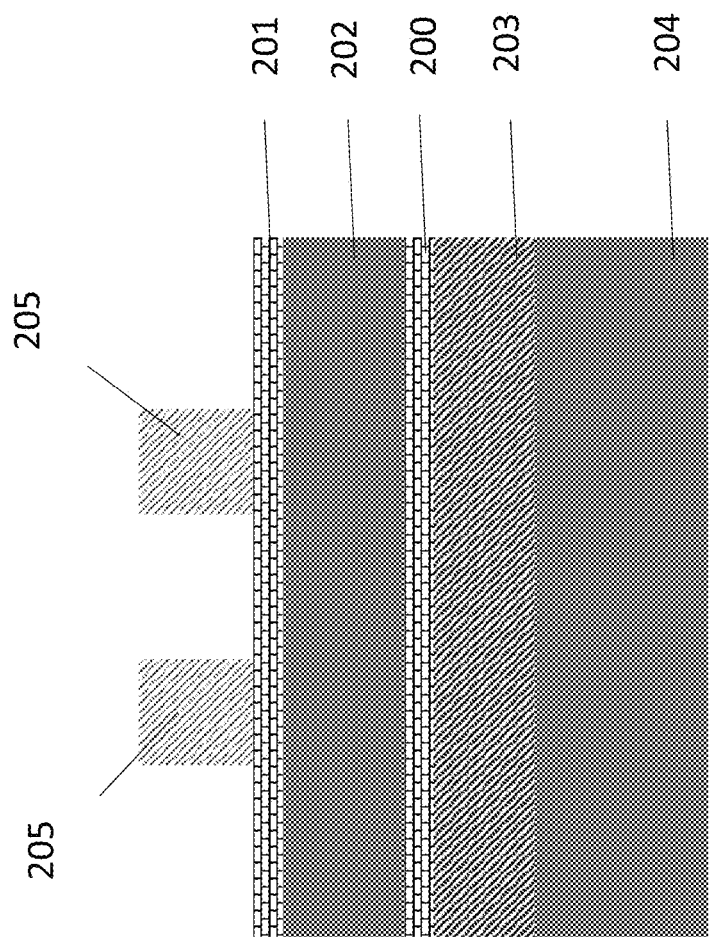
FIG. 2 illustrates a diagram of forming a hard mask disposed on the second heterostructure layer.
Figure 3:
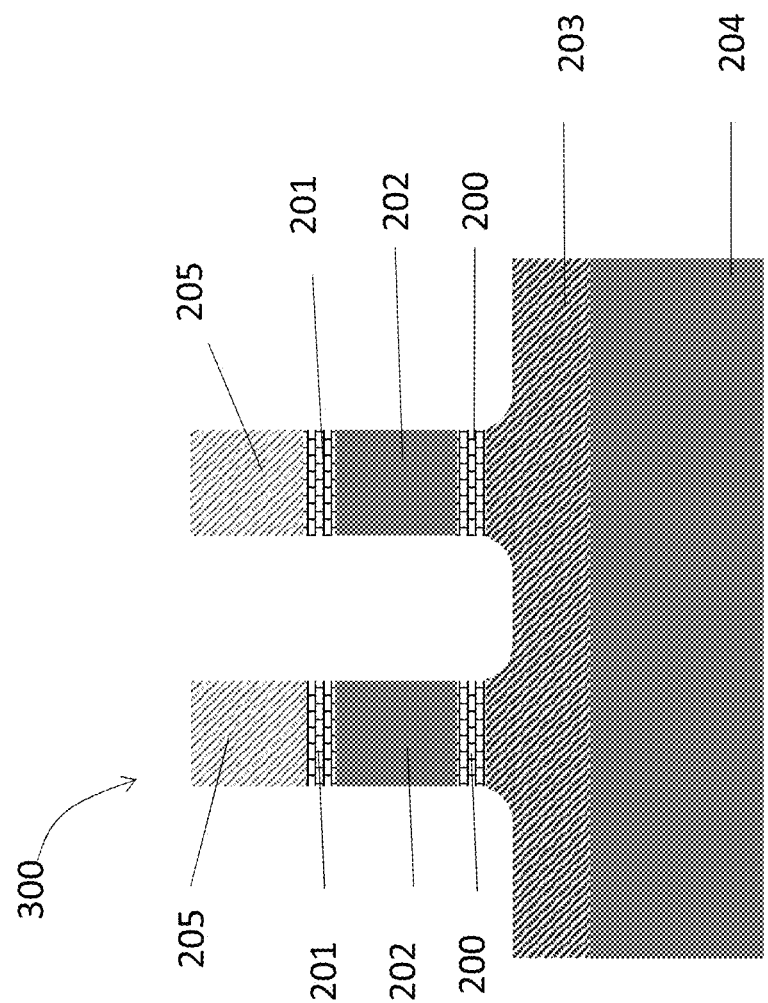
FIG. 3 illustrates a diagram of etching a first fin using a reactive ion etching (RIE) process.
Figure 4:
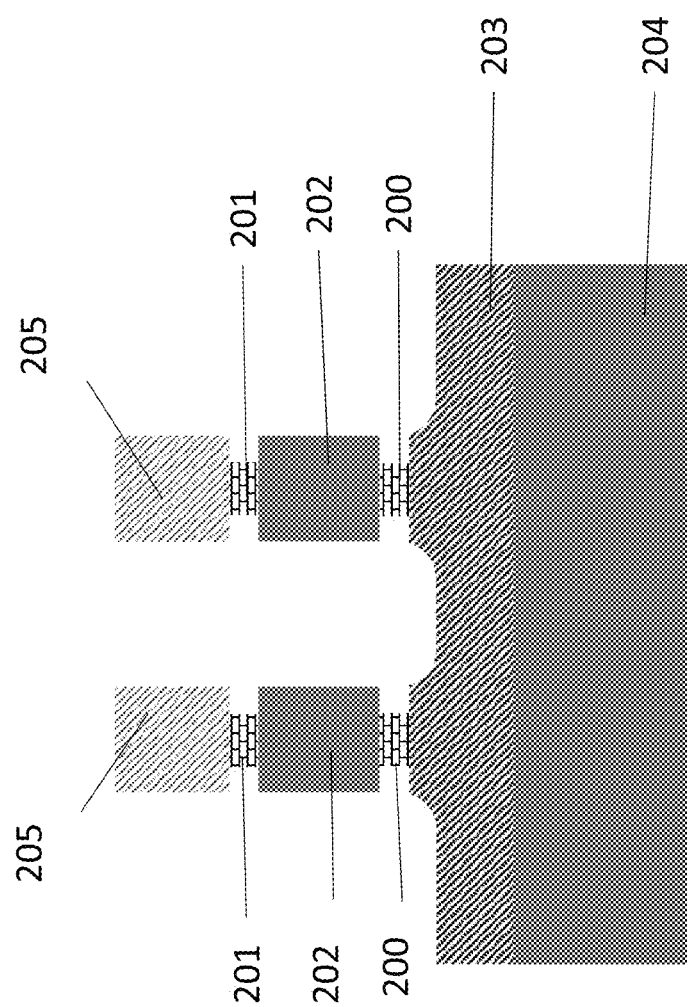
FIG. 4 illustrates a diagram of recessing the first heterostructure layer and the second heterostructure layer such that they are narrower than the first fin and the hard mask.

FIG. 2 illustrates a diagram of forming a hard mask 205 disposed on the second heterostructure. The hard mask can be silicon nitride. Alternatively, the hard mask 205 can contain multiple materials arranged in any forms, including but not limited to silicon nitride, polysilicon, amorphous silicon, and silicon oxide. The hard mask 205 can have a lateral width from about 5 to about 25 nm and ranges there between. FIG. 3 illustrates a diagram of etching to form a first fin 300 using a reactive ion etching (RIE) process. FIG. 4 illustrates a diagram of recessing the first heterostructure layer 200 and the second heterostructure layer 201 such that they are narrower than the first fin 300 and the hard mask 205.

Figure 5:
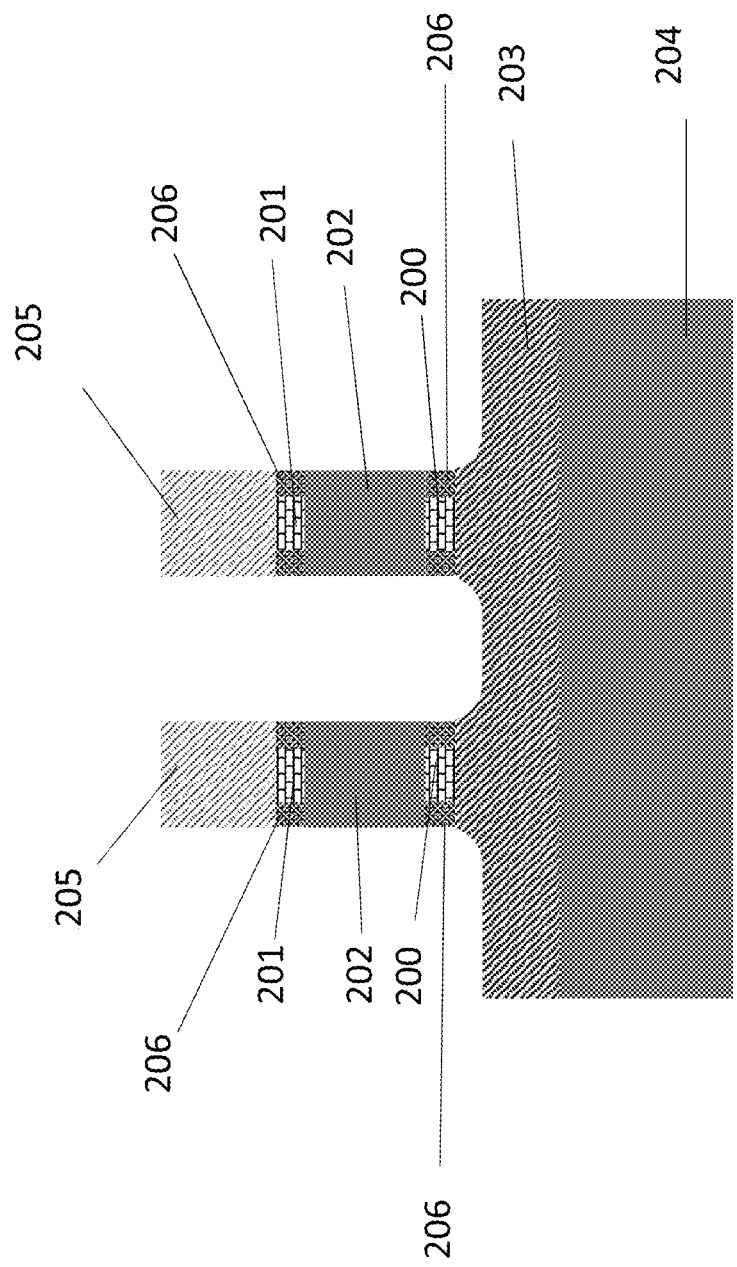
FIG. 5 illustrates a diagram of filling gaps formed by recessing the first heterostructure layer and the second heterostructure layer with a dielectric inner spacer.

FIG. 5 illustrates a diagram of filling gaps formed by the first heterostructure layer 200 and the second heterostructure layer 201 with a dielectric inner spacer 206. This can be done by first conformally depositing inner spacer material to pinch off the gap and then conformally etching back that material on the unwanted surfaces. The etching time can be controlled such that the material filled in the gap remains. The dielectric inner spacer 206 can be a material such as silicon-boron-carbon-nitride (SiBCN) or silicon nitride or SiCO or SiOCN. The shape of the inner spacer may not be perfectly rectangular as shown in the figures. The interface between dielectric inner spacer 206 and the recessed first heterostructure layer 200 and recessed second heterostructure layer 201 may have a convex shape towards the recessed heterostructure layers due to the nature of recess etching. The gate length is determined by the channel layer 202 epitaxial thickness, which is supposed to be well-controlled. As will be clear later in the description, the dielectric inner spacer structure will become part of the gate spacer, and the recessed heterostructures or the regions occupied by the recessed heterostructure will later become the source-drain extension regions. It's clear that the thickness of the dielectric inner spacer and the thickness of the source-drain extension are the same as or very close to the thickness of the heterostructures grown on blanket wafers at the beginning of the process. Therefore, all those thicknesses can be well controlled.

Figure 6:
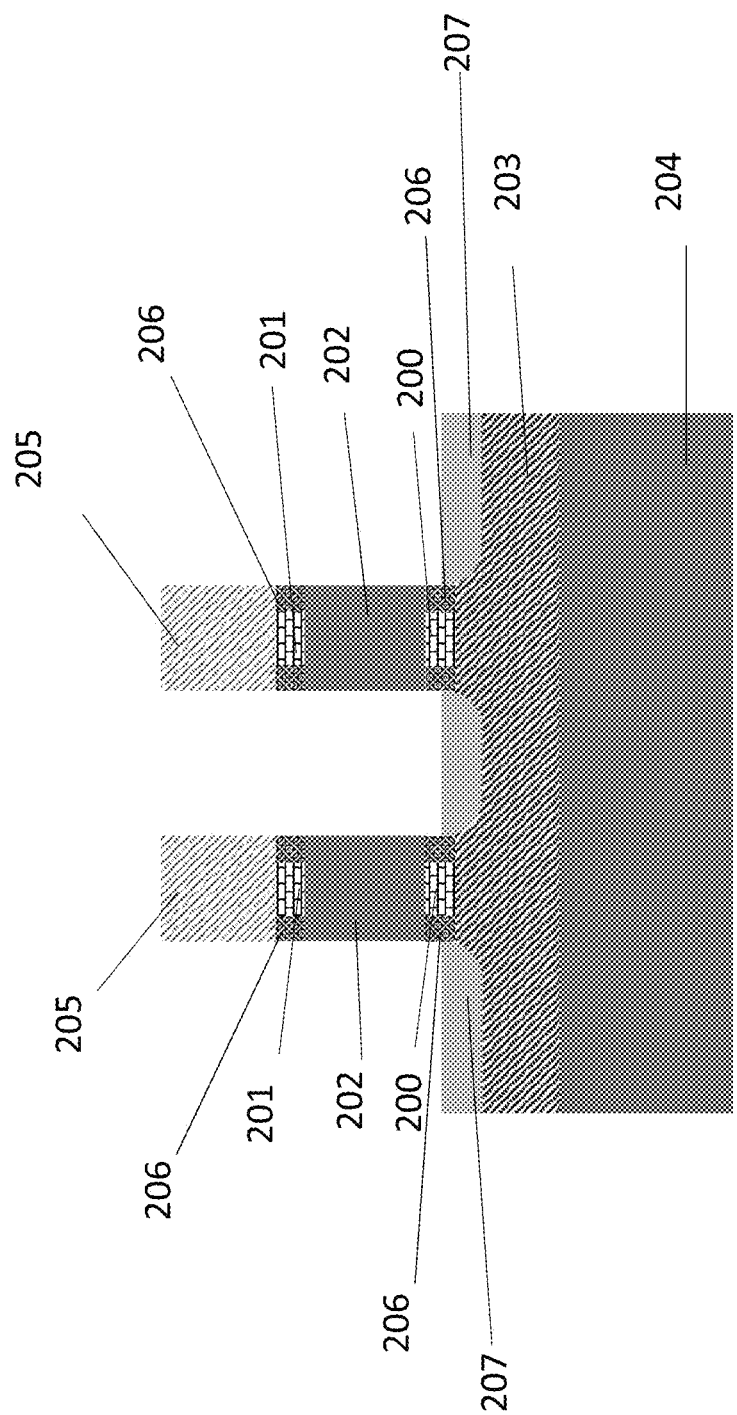
FIG. 6 illustrates a diagram of depositing a dielectric bottom outer spacer over the highly doped bottom source-drain layer.

FIG. 6 illustrates a diagram of depositing a dielectric bottom outer spacer 207 over the highly doped bottom source-drain layer 203. Different dielectric materials such as silicon-boron-carbon-nitride (SiBCN) or silicon nitride or SiCO or SiOCN can be used. The dielectric bottom outer spacer 207 can have a thickness of about 5 to about 15 nm and ranges there between.

Figure 7:
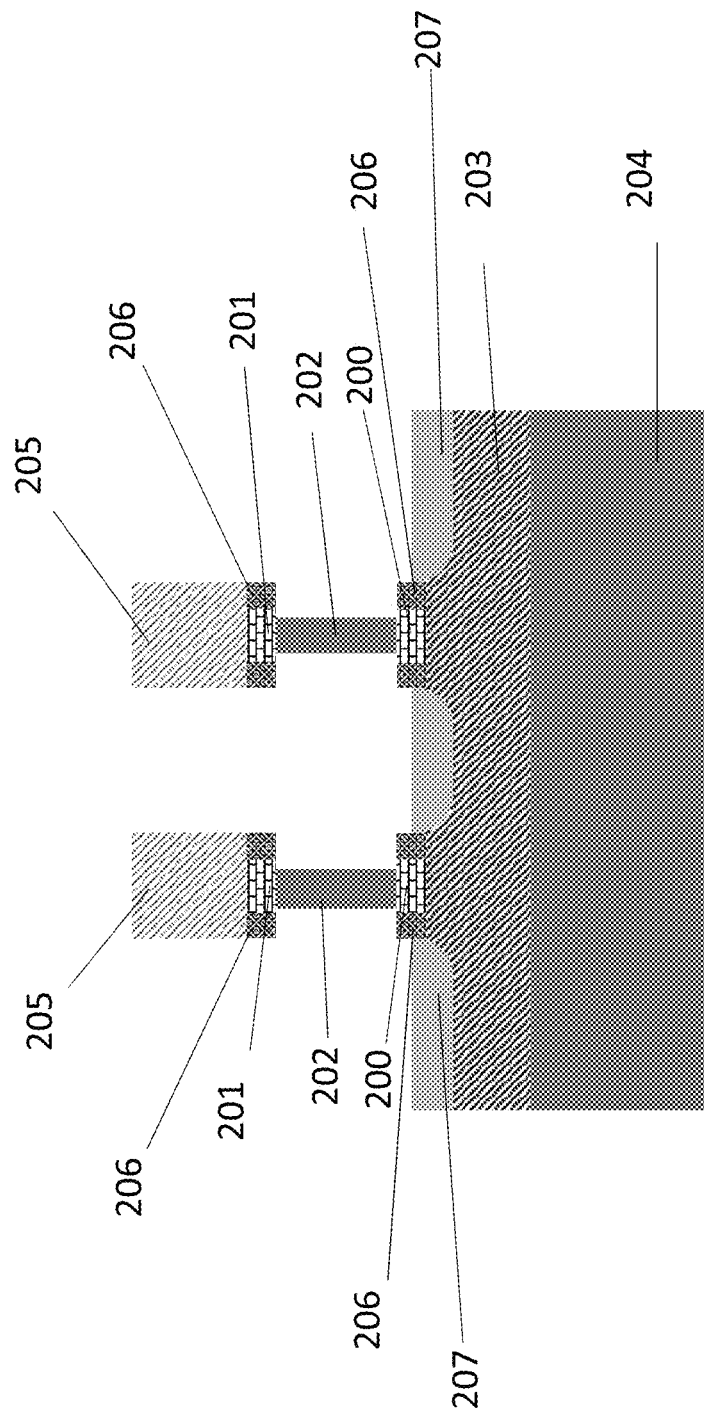

FIG. 7 illustrates a diagram of laterally trimming the channel layer 202 to reach a narrower width of from 3 to about 10 nm and ranges there between. The purpose of lateral trimming is to make the deposited gate metal confined by the top and bottom dielectric inner spacers 206, and also to make the channel have a comparable width as the width of the recessed first heterostructure layer 200 and second heterostructure layer 201. The channel layer 202 is thinned down to target a specific thickness. This can be done by using oxidation process or wet etch process or conformal dry etch process.

Figure 8:
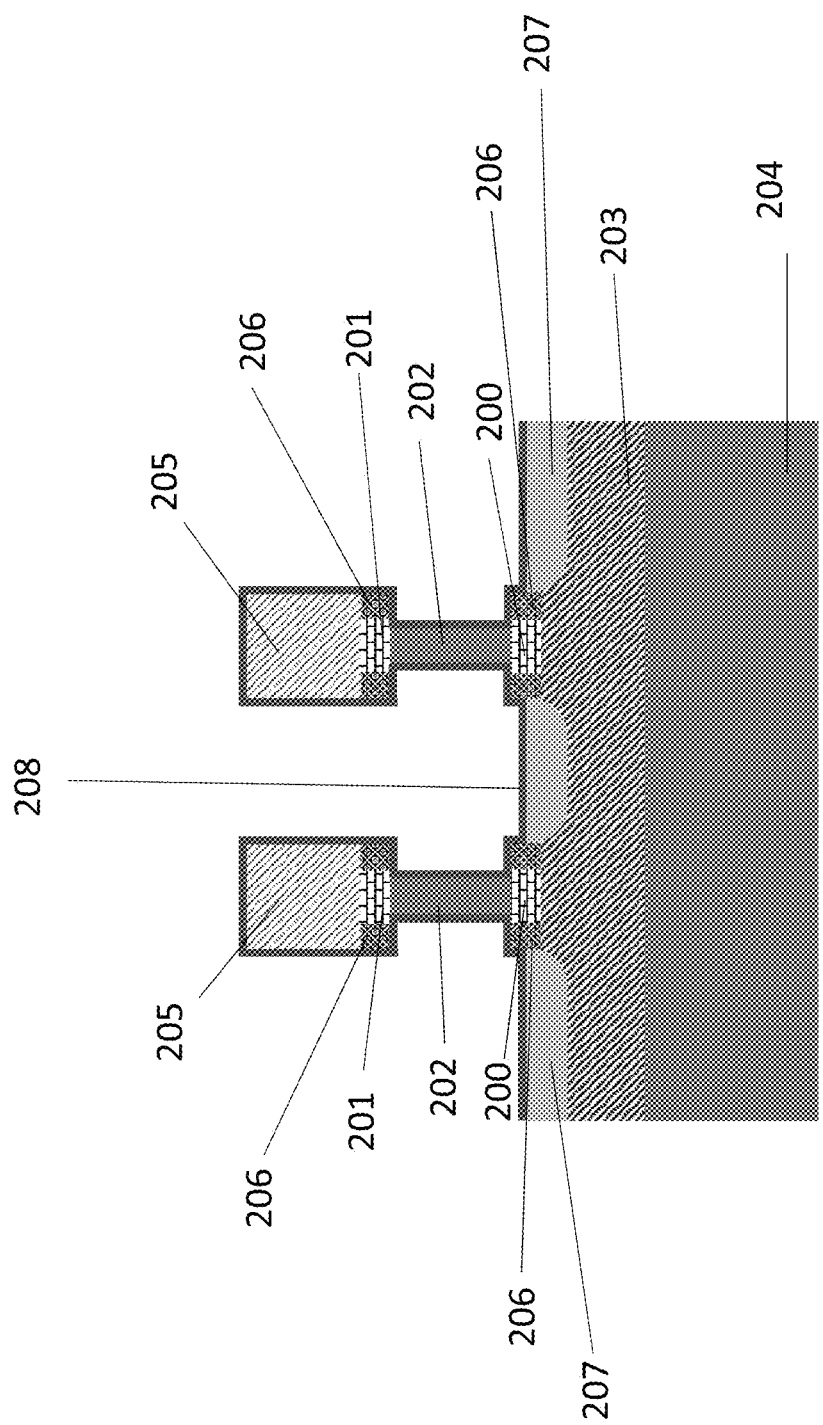
FIG. 8 illustrates a diagram of depositing a high-k dielectric layer on the bottom outer spacer, the first fin and the hard mask.
Figure 9:
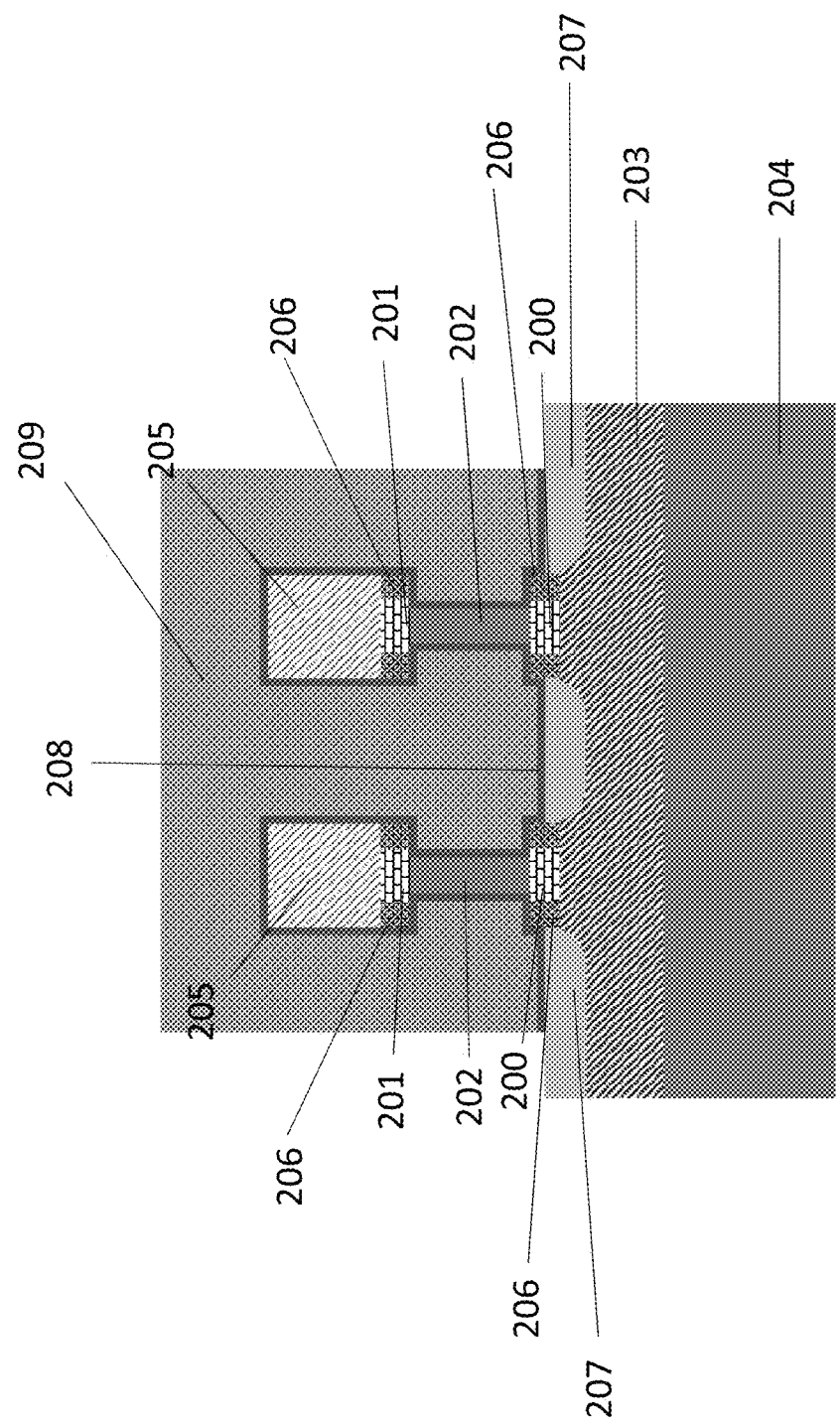
FIG. 9 illustrates a diagram of depositing a metal gate layer on top of the high-k dielectric layer and the dielectric bottom outer spacer.
Figure 10:
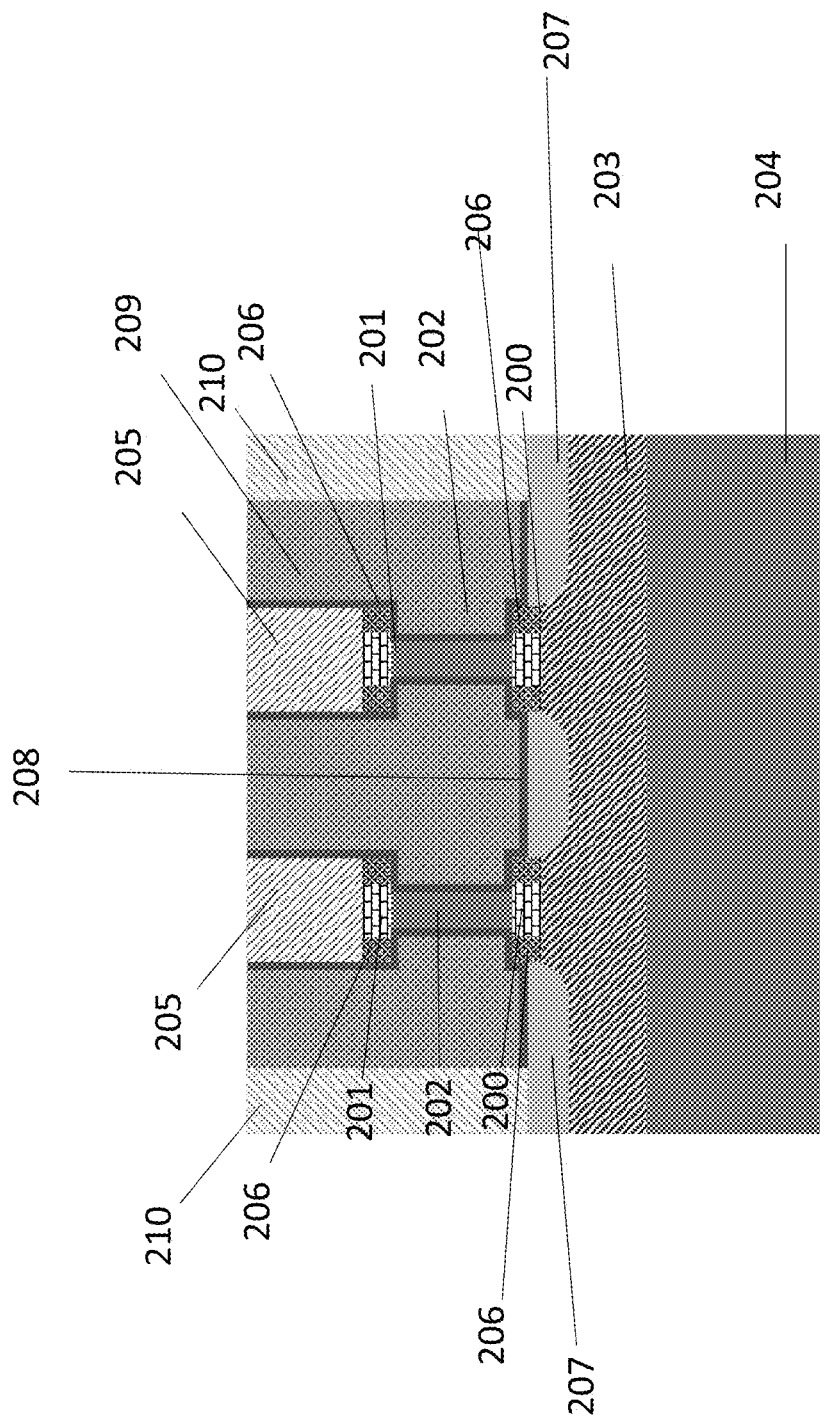
FIG. 10 illustrates a diagram wherein interlayer dielectric (ILD) oxide is formed over the dielectric bottom outer spacer and chemical metal polishing (CMP) is performed on top of the hard mask.

FIG. 8 illustrates a diagram of depositing a high-k dielectric layer 208 on the bottom outer spacer 207, the first fin 300 and the hard mask 205. FIG. 9 illustrates a diagram of depositing a metal gate layer 209 on top of the high-k dielectric layer 208 and the dielectric bottom outer spacer 207. FIG. 10 illustrates a diagram wherein interlayer dielectric (ILD) oxide 210 is formed over the dielectric bottom outer spacer 207 and chemical metal polishing (CMP) is performed on top of the hard mask 205.

Figure 11:
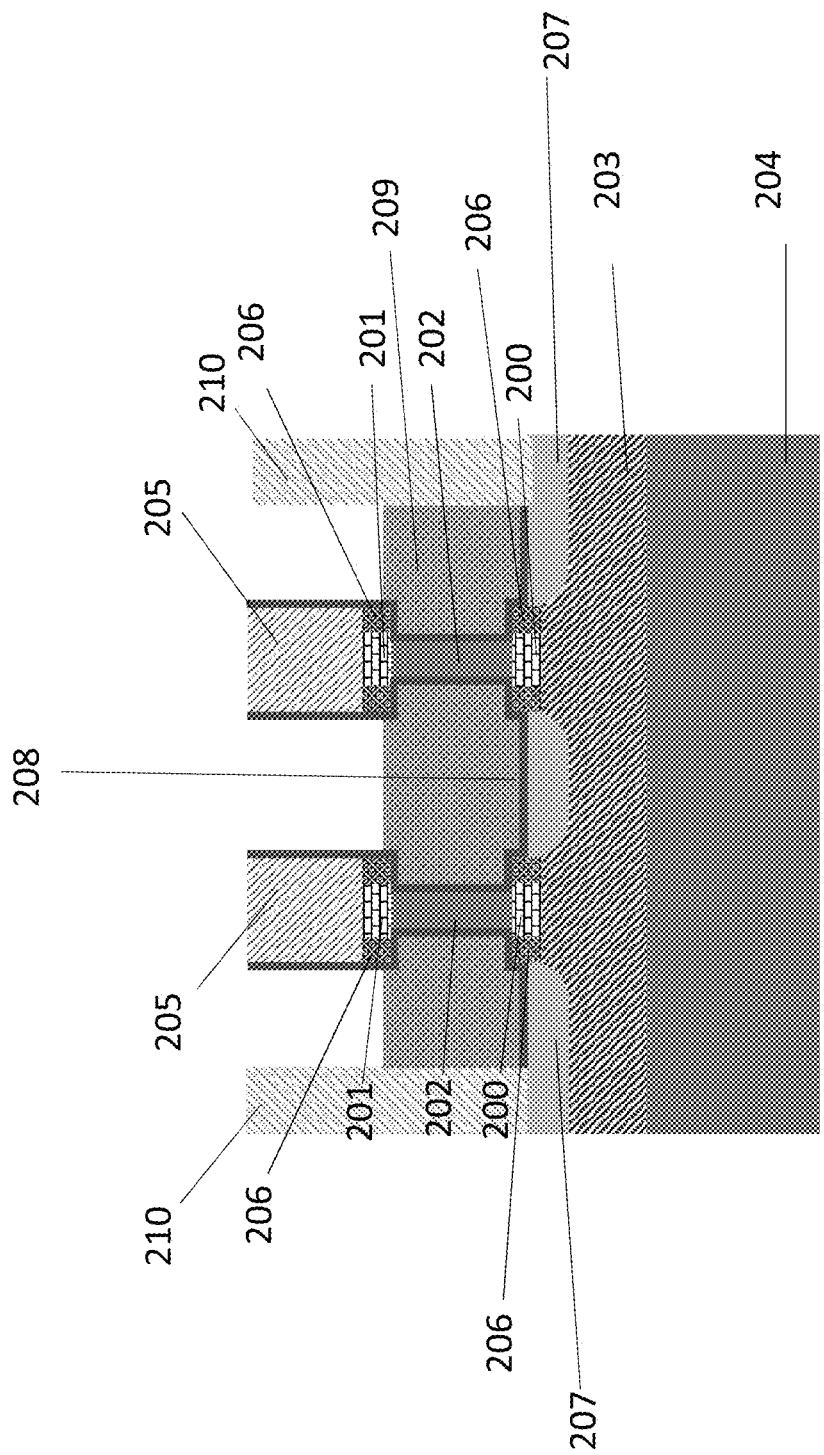
FIG. 11 illustrates a diagram wherein the metal gate layer is etched below the top of hard mask using a RIE process.
Figure 12:
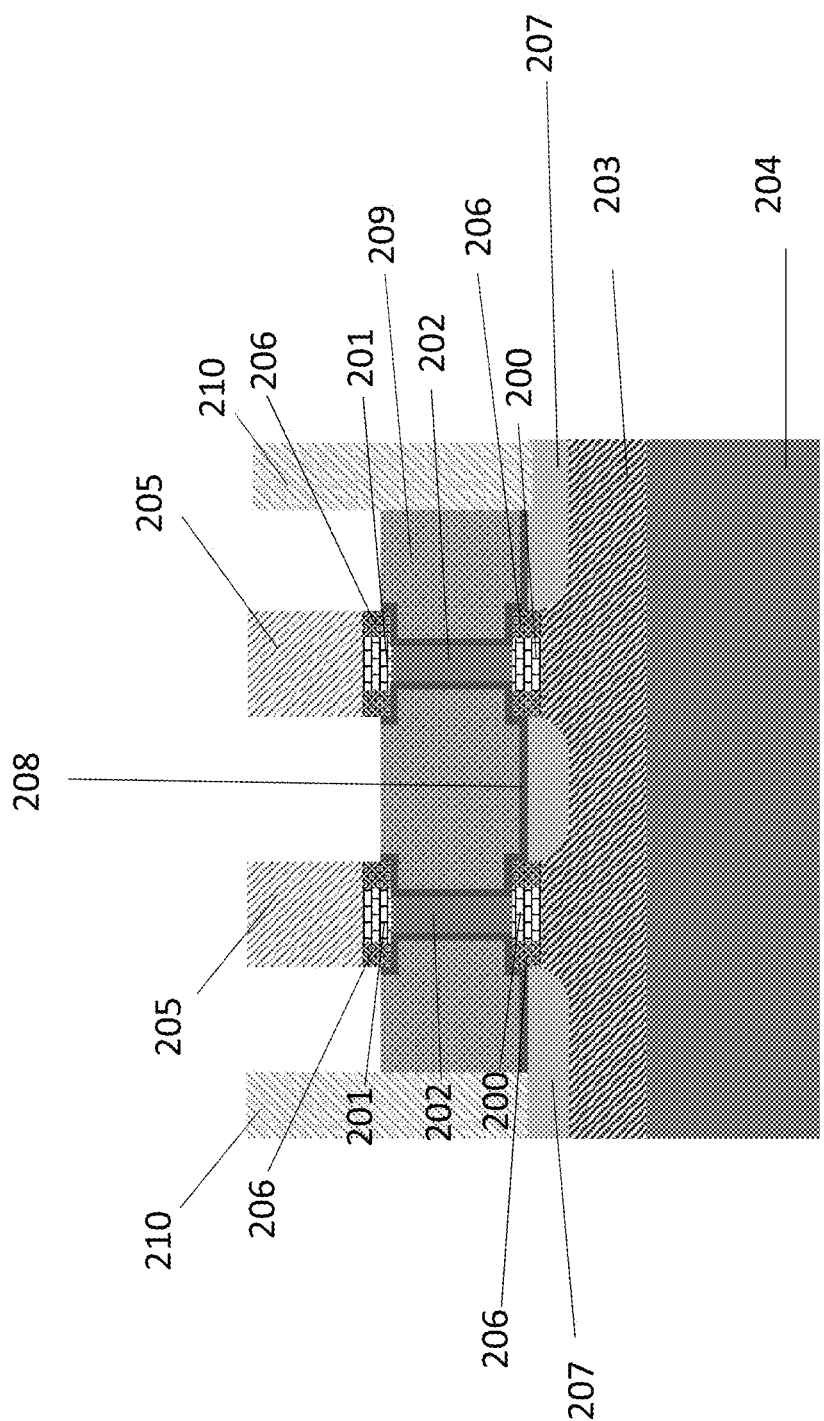
FIG. 12 illustrates a diagram wherein the exposed high-k dielectric is removed from below the top of the hard mask.

FIG. 11 illustrates a diagram wherein the metal gate layer 209 is etched below the top of hard mask 205 using a RIE process. Where the RIE process stops is less critical because the gate length is determined by the dielectric inner spacer 206. Even if the metal gate layer 209 is etched below the dielectric inner spacer 206, it would not affect the gate length. FIG. 12 illustrates a diagram wherein the exposed high-k dielectric 208 is removed from below the top of the hard mask 205.

Figure 13:
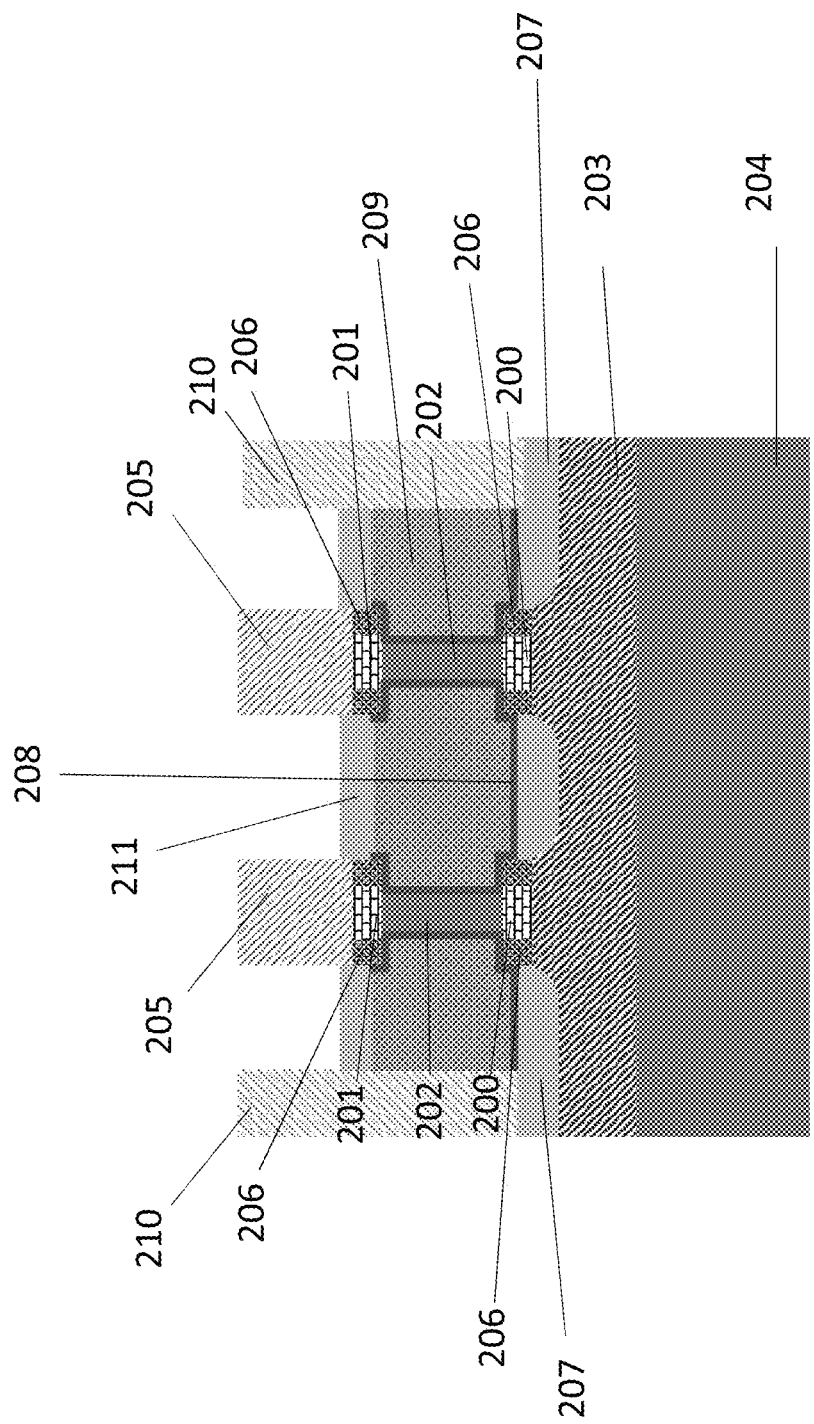
FIG. 13 illustrates a diagram wherein a dielectric top outer spacer is formed after removing the exposed high-k dielectric.
Figure 14:
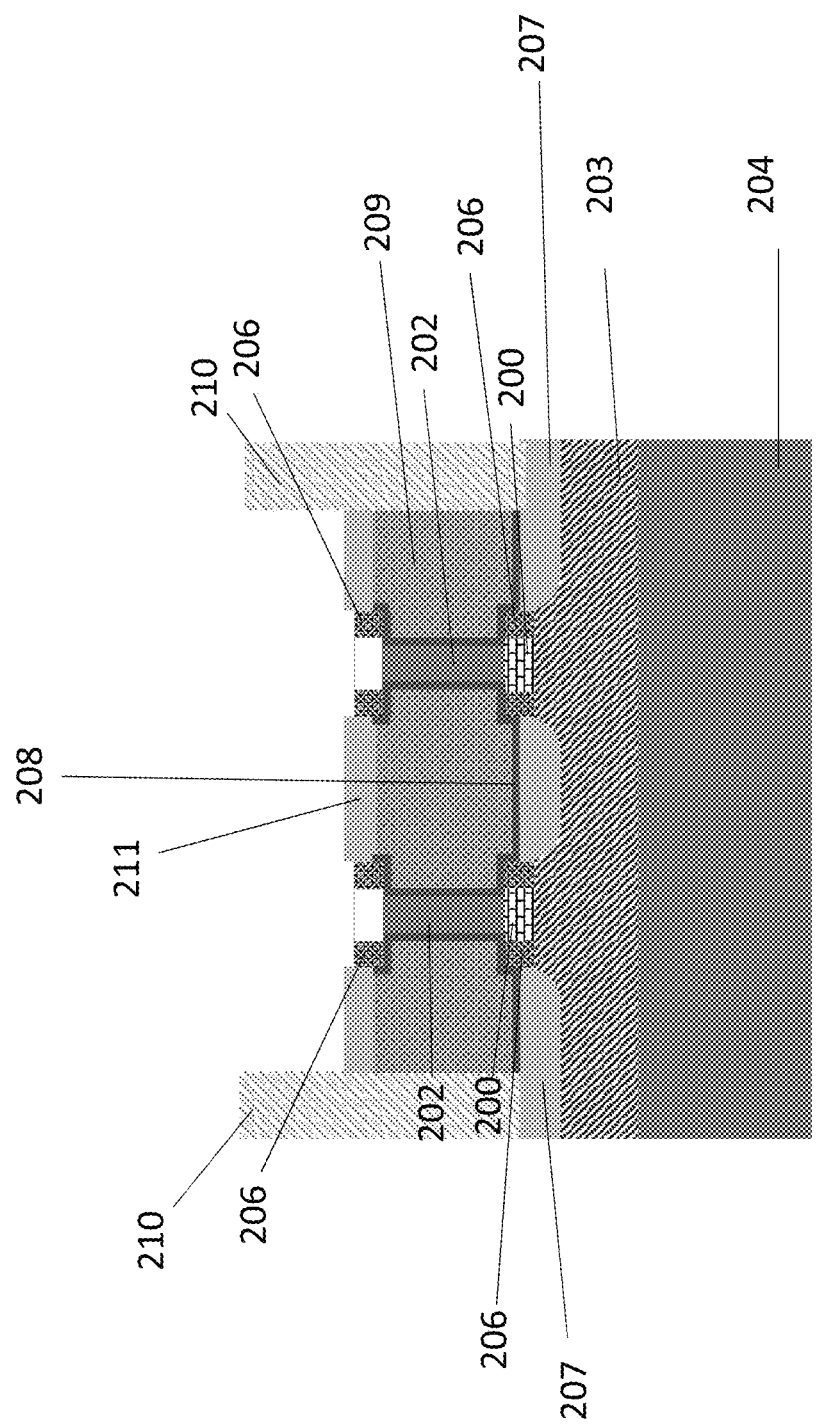
FIG. 14 illustrates a diagram wherein the hard mask is removed and the recessed second heterostructure is also removed.
Figure 15:
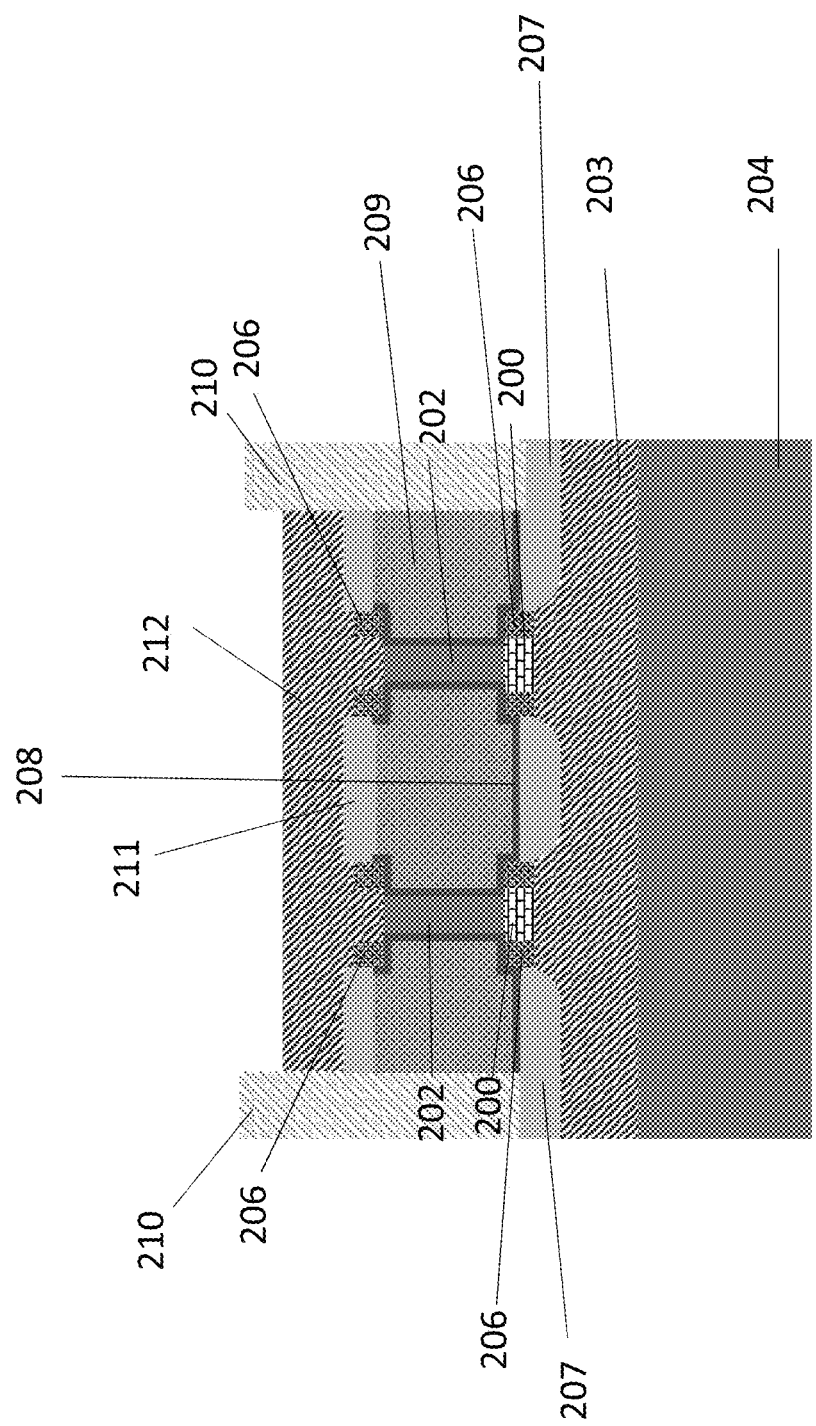
FIG. 15 illustrates a diagram wherein a top source-drain epitaxial layer of a second type is grown on the fin.

FIG. 13 illustrates a diagram wherein a dielectric top outer spacer 211 is formed after removing the exposed high-k dielectric 208. FIG. 14 illustrates a diagram wherein the hard mask 205 is removed and the recessed second heterostructure 201 is also removed. Note that the removal of this second heterostructure is optional. If the second heterostructure is not removed, it will remain in the final device structure acting as the top source-drain extension materials. FIG. 15 illustrates a diagram wherein a top source-drain epitaxial layer 212 of a second type is grown from the exposed channel layer 202, and located on the dielectric top outer spacer 211 and dielectric the inner spacer 206. If the dielectric heterostructure is not removed in FIG. 14, the top source-drain epitaxial layer 212 can start to grow from the second heterostructure layer 201. The top source-drain epitaxial layer 212 can be silicon or silicon germanium. It is clear on FIG. 15 that the gate length is defined by the channel layer 202 thickness and the physical metal gate length is equal or very close to channel layer thickness minus twice the high-k thickness. It is also evident from FIG. 15 how the dielectric inner spacers 206 help define gate length. The dielectric inner spacer 206, as part of the gate spacer, directly contacts the source-drain extension regions.

Figure 16:
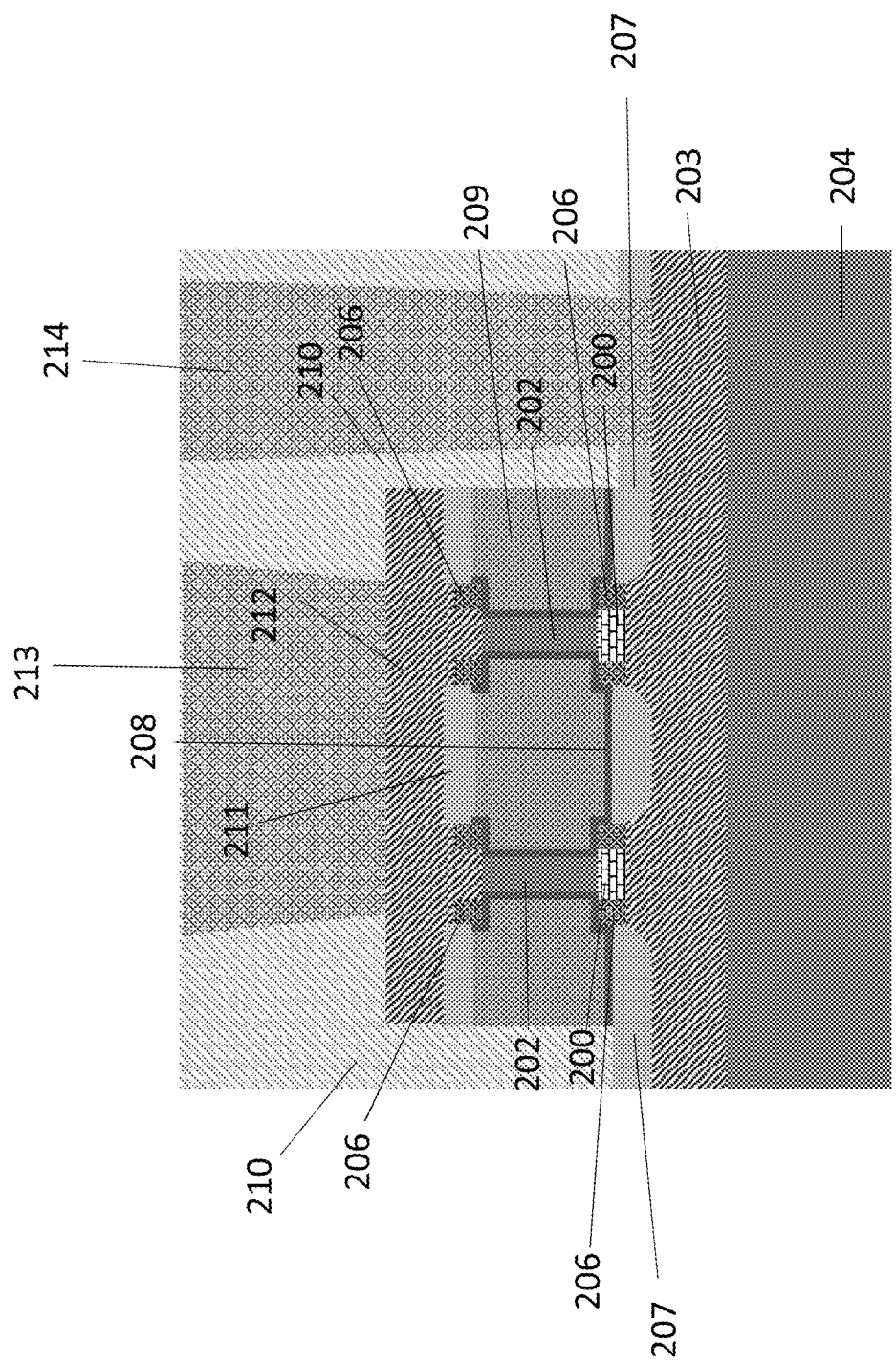
FIG. 16 illustrates a diagram wherein a first contact on the top source-drain epitaxial layer and a second contact on the bottom source-drain layer is formed to complete the final transistor.

FIG. 16 illustrates a diagram a first contact 213 on the top source-drain epitaxial layer 212 and a second contact 214 on the bottom source-drain layer 203 is formed to complete the final transistor 215. The gate contact is located out of the paper surface and therefore not shown.

Figure 17:
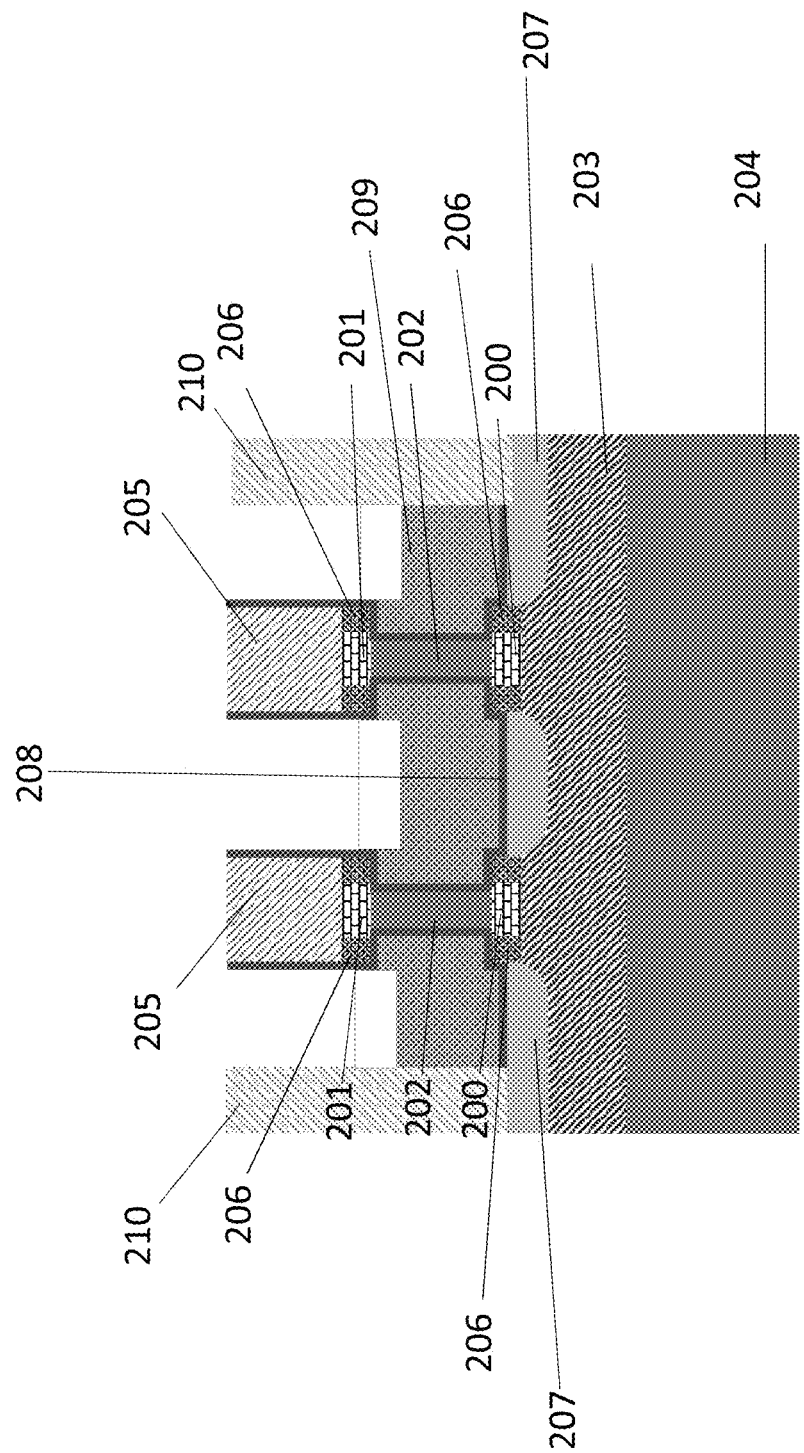
FIG. 17 illustrate a diagram of another embodiment where the metal gate layer is directionally recessed below the second dielectric inner spacer.

FIG. 17 illustrate another embodiment where the metal gate layer 209 is directionally recessed below the second dielectric inner spacer 206. Because metal gate layer 209 is still tucked underneath the top inner spacer, the physical gate length is not affected.

What is claimed is:

1. A vertical field-effect transistor (FET) structure comprising:
- a substrate of a first type;
- a highly doped bottom source-drain layer disposed on the substrate of the first type;
- a dielectric bottom outer spacer disposed on the highly doped bottom source-drain layer;
- a recessed first heterostructure layer disposed on the highly doped bottom source-drain layer;
- a channel layer disposed on the recessed first heterostructure layer;
- a recessed second heterostructure layer disposed on the channel layer;
- a first dielectric inner spacer disposed between the dielectric bottom outer spacer and the recessed first heterostructure layer;
- a fin including the recessed first and the second heterostructure layers and the channel layer;
- a high-k dielectric layer disposed on the dielectric bottom outer spacer and the channel layer;
- a metal gate layer disposed on top of the high-k dielectric layer;
- a dielectric top outer spacer disposed on top of the high-k dielectric layer and the metal gate layer;
- a second dielectric inner spacer disposed between the dielectric top outer spacer and the recessed second heterostructure layer; and
- a top source-drain epitaxial layer of a second type disposed on the first fin and the dielectric top inner spacer and the dielectric top outer spacer.

2. The vertical FET structure of claim 1, wherein the first dielectric inner spacer comprises silicon-boron-carbon-nitride (SiBCN).

3. The vertical FET structure of claim 1, wherein the second dielectric inner spacer comprises silicon-boron-carbon-nitride (SiBCN).

4. The vertical FET structure of claim 1, further comprising a first contact disposed on the top source-drain epitaxial layer.

5. The vertical FET structure of claim 1, further comprising a second contact disposed on the highly doped bottom source-drain layer.

6. The vertical FET structure in claim 1, further comprising an interlayer dielectric oxide between the first contact and the second contact.

7. The vertical FET structure of claim 1, wherein the recessed first heterostructure layer comprises silicon germanium.

8. The vertical FET structure of claim 1, wherein the recessed second heterostructure layer comprises silicon germanium.

9. The vertical FET structure of claim 1, wherein the channel layer has a thickness of between 3 nm to 10 nm.

10. The vertical FET structure of claim 1, wherein the dielectric bottom outer spacer has a thickness of between 5 nm to 15 nm.

11. A vertical field-effect transistor (FET) structure comprising:
- a substrate of a first type;
- a highly doped bottom source-drain layer disposed on the substrate of the first type;
- a dielectric bottom outer spacer disposed on the highly doped bottom source-drain layer;
- a recessed first heterostructure layer disposed on the highly doped bottom source-drain layer;
- a channel layer disposed on the recessed first heterostructure layer;
- a recessed second heterostructure layer disposed on the channel layer;
- a first dielectric inner spacer disposed between the dielectric bottom outer spacer and the recessed first heterostructure layer;
- a fin including the recessed first and the second heterostructure layers and the channel layer;
- a high-k dielectric layer disposed on the bottom outer spacer and the channel layer;
- a dielectric top outer spacer disposed on top of the high-k dielectric layer;
- a second dielectric inner spacer disposed between the dielectric top outer spacer and the recessed second heterostructure layer;
- a metal gate layer disposed on top of the high-k dielectric layer and directionally recessed below the second dielectric inner spacer; and
- a top source-drain epitaxial layer of a second type disposed on the first fin, the dielectric top inner spacer, and the dielectric top outer spacer.

12. The vertical FET structure of claim 11, wherein the first dielectric inner spacer comprises silicon-boron-carbon-nitride (SiBCN).

13. The vertical FET structure of claim 11, wherein the second dielectric inner spacer comprises silicon-boron-carbon-nitride (SiBCN).

14. The vertical FET structure of claim 11, further comprising a first contact disposed on the top source-drain epitaxial layer.

15. The vertical FET structure of claim 11, further comprising a second contact disposed on the highly doped bottom source-drain layer.

16. The vertical FET structure in claim 11, further comprising an interlayer dielectric oxide between the first contact and the second contact.

17. The vertical FET structure of claim 11, wherein the recessed first heterostructure layer comprises silicon germanium.

18. The vertical FET structure of claim 11, wherein the recessed second heterostructure layer comprises silicon germanium.

19. The vertical FET structure of claim 11, wherein the channel layer has a thickness of between 3 nm to 10 nm.

20. The vertical FET structure of claim 11, wherein the dielectric bottom outer spacer has a thickness of between 5 nm to 15 nm.

* * * * *